United States Patent
Yim et al.

(10) Patent No.: US 7,298,207 B2
(45) Date of Patent: Nov. 20, 2007

(54) AUTOMATIC GAIN CONTROL FOR A MULTI-STAGE GAIN SYSTEM

(75) Inventors: Susan Yim, Plano, TX (US); Udayan Dasgupta, Irving, TX (US); Sandeep Oswal, Kamataka (IN); Murtaza Ali, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 255 days.

(21) Appl. No.: 10/966,981

(22) Filed: Oct. 15, 2004

(65) Prior Publication Data

US 2005/0127993 A1   Jun. 16, 2005

Related U.S. Application Data

(60) Provisional application No. 60/529,414, filed on Dec. 11, 2003.

(51) Int. Cl.
*H03F 3/04* (2006.01)
*H03F 3/68* (2006.01)

(52) U.S. Cl. ............... 330/133; 330/310; 330/311; 330/278; 330/285; 330/254; 327/560; 333/18

(58) Field of Classification Search ............... 330/133, 330/310, 311, 3, 278, 150, 279, 285, 254; 327/560; 333/28 R, 18; 455/241.1, 245.2, 455/251.1, 253.2
See application file for complete search history.

(56) References Cited

U.S. PATENT DOCUMENTS

| | | | |
|---|---|---|---|
| 6,480,068 B1 * | 11/2002 | Mujica et al. | 330/279 |
| 6,498,927 B2 * | 12/2002 | Kang et al. | 455/245.2 |
| 6,744,330 B1 * | 6/2004 | Jones et al. | 333/28 R |
| 6,927,628 B2 * | 8/2005 | Oshima et al. | 330/133 |
| 2003/0076906 A1 | 4/2003 | Mujica | |

* cited by examiner

*Primary Examiner*—Michael B Shingleton
(74) *Attorney, Agent, or Firm*—Steven A. Shaw; W. James Brady; Frederick J. Telecky, Jr.

(57) ABSTRACT

Systems and methods are disclosed for providing automatic gain control of a multi-stage system. A method can include defining at least one parameter that is adapted to at least one of maximize hardware capacity of each of a plurality of gain stages and mitigate part-to-part variations of the multi-stage system. An order is selected for training the plurality of stages based on relative noise dominance for the plurality of stage. For a given stage of the plurality of stages, which is selected according to the selected order, output signals of the multi-stage system are measured over a plurality of gain settings for the given stage. A gain setting of the given stage of the multi-stage system also is configured based on the measured output signals relative to the at least one parameter defined for the given stage. The plurality of gain stages can include an analog equalizer as well programmable gain amplifiers connected in series.

28 Claims, 4 Drawing Sheets

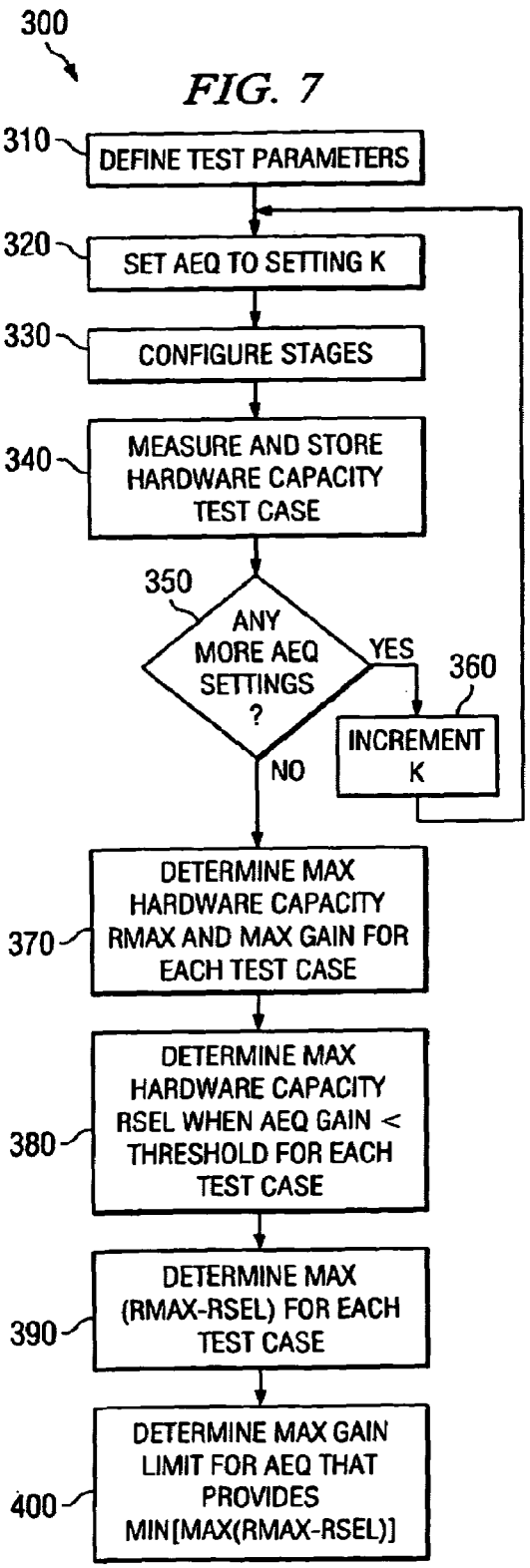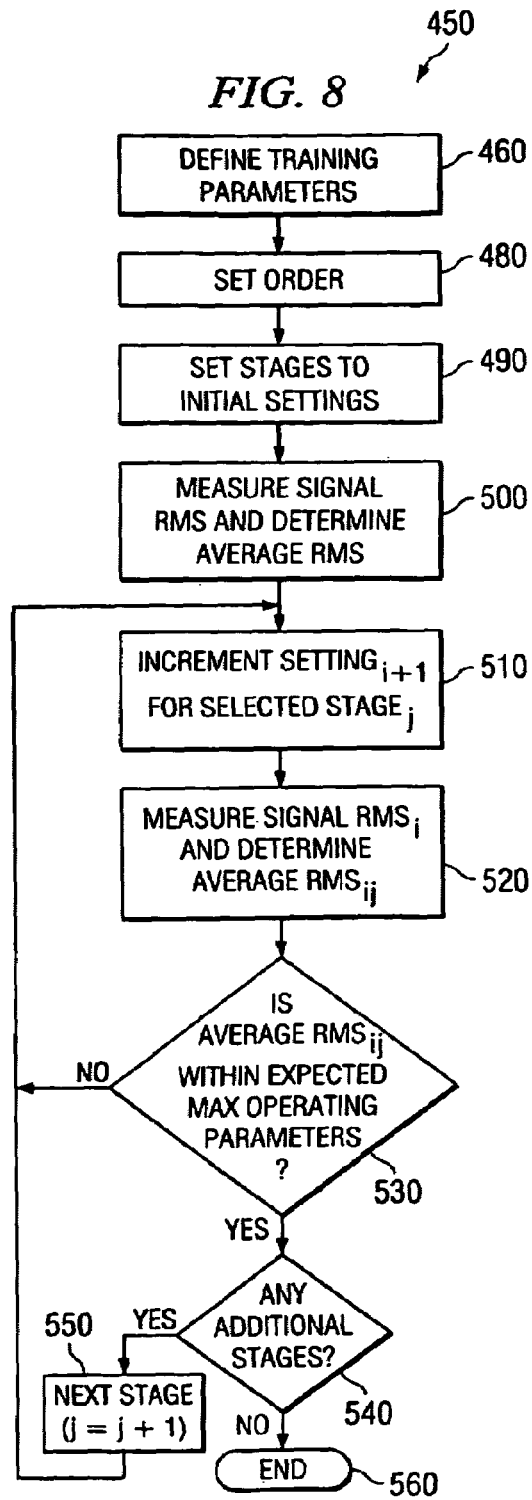

AUTOMATIC GAIN CONTROL FOR A MULTI-STAGE GAIN SYSTEM

CROSS-REFERENCE TO RELATED APPLICATION

This application claims the benefit of U.S. Provisional Patent Application No. 60/529,414, which was filed Dec. 11, 2003, and which is incorporated herein by reference.

TECHNICAL FIELD

This invention relates generally to amplification of signals, and more specifically relates to a system and method to facilitate automatic gain control for a multi-stage gain system.

BACKGROUND

Multi-stage gain amplifiers are widely utilized in telecommunications and other applications where signals are transmitted and received. The applications can include both wireless and wired transmission and reception of signals.

Research and development in telecommunications applications have been expanding to meet the increasing popularity in the Internet. One particular application relates to digital subscriber line (DSL) technologies, including both symmetric DSL (SDSL) and asymmetric DSL (ADSL). ADSL is a modem technology that converts existing telephone lines into access paths for multimedia and high speed data communications. ADSL utilizes advanced digital signal processing and creative algorithms to provide greater amounts of information through twisted-pair telephone lines than was conventionally feasible. The ADSL standard calls for a specifically designed modem at each end of a twisted pair copper line, one at a home and the other at a central office of the phone company. Although the conventional telephone voice circuit has only a 4 KHz bandwidth, the physical wire connection bandwidth exceeds 1 MHz.

ADSL exploits the extra bandwidth to send data to the central office where it can connect to a phone company's high capacity fiber optic network. ADSL modems increase the amount of information that conventional phone lines can carry buy using discrete multi-tone technology (DMT). DMT divides the bandwidth into independent subbands, then transmits data on all of the subbands simultaneously. Echo cancellation techniques allow upstream and downstream data to overlap. ADSL is particularly attractive for consumer Internet applications where most of the data traffic is downloaded to the customer. Upstream bandwidth for uploading data can be reduced to increase downstream bandwidth since most Internet traffic is downstream.

Terminals employed at the central office typically communicate over several channels. These terminals employ modems or other communication devices for data transmissions. These modems or other communication devices can employ a digital processor, a coder/decoder component, line drivers and other peripheral devices to support transmitting and receiving of analog signal transmissions. The central office line driver drives the ADSL signal onto telephone lines. The ADSL signal includes data streams that are carried over tones that are amplitude, phase modulated and frequency separated by about 4 KHz. Conventional ADSL modem designs include functions referred to as analog front ends in which operations, such as digital-to-analog and analog-to-digital conversion, amplification/attenuation and filtering, are performed. Because of the frequencies involved in ADSL technology, which can range from tens of KHz to MHz frequencies, and because of the large dynamic range required in order to accommodate the wide variations in length and schemes for subscriber loops, the amplification and filtering can be very complex, particularly in an integrated circuit.

Analog amplification or attenuation is typically needed in the received path of most digital modems to fully utilize the available digital dynamic range. Typically, the gain adjustment depends on the particular channel conditions and loop characteristics. Therefore, automatic gain control is preferable. When the PGA and filtering stages are interleaved, as in typical integrated analog front ends, the automatic gain control process becomes more complicated since, in most environments, the intermediate points in the receive path are inaccessible.

SUMMARY

One aspect of the present invention provides a method for providing automatic gain control of a multi-stage system. The method includes defining at least one parameter associated with at least some of a plurality of gain stages of the multi-stage system. An order is selected for training the plurality of stages based on relative noise dominance for the plurality of stage. For a given stage of the plurality of stages selected according to the selected order, output signals of the multi-stage system are measured over a plurality of gain settings for the given stage. A gain setting of the given stage of the multi-stage system also is configured based on the measured output signals relative to the at least one parameter defined for the given stage. The plurality of gain stages can include an analog equalizer as well programmable gain amplifiers connected in series. By treating the analog equalizer as a gain stage, automatic gain control is facilitated so as to achieve a maximum hardware capacity and to mitigate part-to-part variations in the multi-stage system.

Another aspect of the present invention provides a digital signal processor programmed to perform an automatic gain control algorithm for a plurality of gain stages of a multi-stage gain system. The automatic gain control algorithm selects an order for training the plurality of stages of the multi-stage system based on relative noise dominance among the plurality of stages. Each of the plurality of stages is configured according to the selected order. The configuration of a given stage of the plurality of stages includes incrementing a gain setting for the given stage, measuring output signals over a plurality of frames at the incremented gain setting of the given stage and evaluating the measured output signals relative to a parameter limit defined for the given stage for the incremented gain setting for the given stage. The incrementing, measuring and evaluating can be repeated for a next gain setting of the given stage based on based on the evaluation (e.g., determining that the incremented gain setting does not at least afford a maximum hardware capacity for the given stage and mitigate part-to-part variations). The gain setting of the given stage is then set based on determining that the incremented gain setting affords a maximum hardware capacity for the given stage.

Still another aspect of the present invention provides a programmable gain system that includes a plurality of serially coupled stages, each of the plurality of gain stages having an associated programmable gain setting. A control system, during a training phase, sets the associated gain setting of each of the plurality of gain stages in an order. The associated gain setting being set to maximize hardware capacity and to mitigate part-to-part variation in the gain system based on at least one predetermined parameter.

BRIEF DESCRIPTION OF THE DRAWINGS

FIG. 7 depicts an example of a method for implementing a first phase of automatic gain control in accordance with aspect of the present invention.

FIG. 8 depicts an example of a method for implementing a second phase of automatic gain control in accordance with aspect of the present invention.

DETAILED DESCRIPTION

Figure 1:
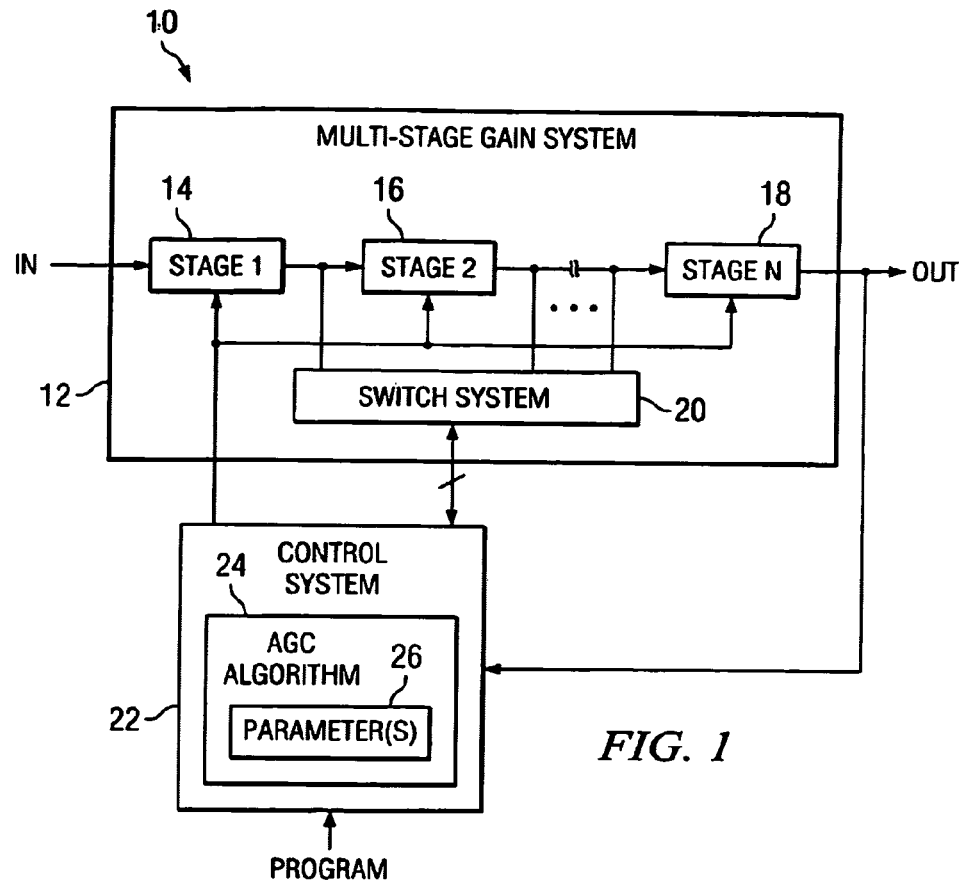
FIG. 1 depicts a block diagram of a multi-stage gain system that can be implemented in accordance with an aspect of the present invention.

FIG. 1 depicts an example of a programmable amplifier system 10 that can be implemented according to an aspect of the present invention. The amplifier system 10 includes a multi-stage gain system 12 including in a plurality of stages 14, 16 and 18. The stages 14, 16 and 18 are connected in series to receive an INPUT signal at an input thereof and to provide the corresponding OUTPUT signal at an output portion thereof. While three stages 14, 16, and 18 are illustrated in the example of FIG. 1, those skilled in the art will understand and appreciate that the multi-stage system 12 can include any plurality of two or more stages coupled between the input and outputs thereof. Additionally, one or more filters can be interleaved in the system 10 to mitigate noise from the INPUT signal as well as noise attributable to the stages 14, 16 and 18.

Each of the stages 14, 16 and 18 can include a plurality of settings, each of which can provide a gain for each respective stage. Each of the stages 14, 16 and 18 may also have an associated variation in gain that can differ between devices, such as due to analog process variations among devices. One or more of the stages 14, 16 and 18 can be implemented as a programmable gain amplifier (PGA) stage.

Additionally or alternatively, another of the stages 14, 16 or 18 can be implemented as an analog equalizer (AEQ). The AEQ is a device operative to partially equalize the channel, and also has an associated gain, which gain can vary as a function of frequency (e.g., dB/MHz). Accordingly, an AEQ is treated as a gain stage for purposes of implementing automatic gain control for the multi-stage system 10 in accordance with an aspect of the present invention. That is, the approach described herein trains the AEQ stage of the multi-stage system 12 using a criterion based on power gain instead of the more conventional channel slope. This is in contrast to a more traditional approach in which the AEQ is selected based on channel slope. When the AEQ is selected based on channel slope, the AEQ setting contributes to some power gain at some loop configurations, and hence the gain control might have to scale back the gains of other stages to compensate for the gain contribution from the AEQ.

According to one example, the INPUT signal can be provided by a hybrid circuit (not shown). In a typical Asymmetric Digital Subscriber Line (ADSL) system, for example, a hybrid circuit is used within the central office modem (in parallel with the subscriber loop interface circuit) to separate transmit signal from the receive signal path. The hybrid circuit characteristics are typically designed to match the transfer function associated with a subscriber loop. The degree to which it achieves this matching dictates the effectiveness of the hybrid circuit. The OUTPUT signal can be provided to an analog-to-digital converter (ADC) that converts the analog output signal to a corresponding digital signal that can be processed in a manner according to the particular context in which the amplifier system 10 is implemented.

A switch system 20 can be coupled to one or more selected nodes between respective stages 14, 16 and 18. A control system 22 can control the switch system 20 for monitoring and measuring signal characteristics of a selected portion of a path including one or more of the stages 14, 16 and 18. The switch system 20 can include one or more switches coupled to intermediate nodes, which switches can be activated and deactivated by the control system 22 to monitor internal nodes as well as to isolate selected stages from the multi-stage system 12, such that a selected portion of the path can be monitored.

The control system 22 also includes an automatic gain control (AGC) algorithm 24 to control gain settings for at least some of the stages 14, 16 and 18 of the multi-stage system 12. The AGC algorithm 24 includes parameters 26 that are utilized to program gain for each of the respective stages 14, 16, and 18 according to an aspect of the present invention. The control system 22 can employ the AGC algorithm during a training phase, which can be implemented periodically or intermittently during operation.

As described herein, the AGC algorithm 24 is operative to configure the multi-stage system 12 to achieve a maximum hardware capacity. The maximum hardware capacity can vary according to the context or environment in which the system 10 is implemented. As used herein, the term "maximum hardware capacity" is meant to include a substantially maximum performance capability (e.g., maximum average data rate) for the multi-stage system 12, minimum part-to-part variations associated with the system 12, as well as a combination of maximum data rate that affords minimum variations.

The control system 22 thus employs the AGC algorithm 24 during a training phase to distribute gains across the respective stages 14, 16, and 18. The AGC algorithm 24 operates to distribute the gains so as to maximize the dynamic range of the multi-stage system 12 without saturation as well as to minimize the overall noise floor, for the multi-stage system 12. As mentioned above, the AGC algorithm 24 also operates to mitigate capacity variations among devices, such as may arise from analog process variations in the components that form the respective stages.

The AGC algorithm 24 operates on the stages 14, 16, and 18 according to an order that varies depending on the relative noise dominance of the respective stages over a range of operating conditions. As used herein, "noise dominance" corresponds to a relative effectiveness of the plurality of stages 14, 16 and 18 to reduce noise in the signal path that includes the respective stages. Thus, a most noise dominant stage has a gain setting that can be selected to most effectively reduce noise in the signal path. Depending on the relative noise dominance of the respective stages 14, 16 and 18, the AGC algorithm 24 can implement multiple iterations for configuring the more dominant stages to facilitate achieving maximum hardware capacity. One or more dominant stages in the system 12 can be determined from simulation. The simulation can include ascertaining noise characteristics, such as an input referred noise floor for the different noise-contributing components in the system 12. Based on an analysis of the noise characteristics for the multi-stage system 12, one or more stages that are most effective to reduce noise are determined, which effectiveness determines the order for configuring the stages. The AGC algorithm 24 utilizes the order to distribute the respective gains in the stages 14, 16 and 18. In this way, the AGC algorithm 24 can achieve an overall maximum gain that maximizes the hardware capacity for the multi-stage system 12. This also can mitigate part-to-part variations in the system 12.

By way of further example, the parameters 26 of the AGC algorithm 24 can be predetermined as limits or threshold values that establish a maximum hardware capacity for the stages 14, 16, and 18 of the multi-stage gain system 12. For instance, a maximum gain limit parameters for an AEQ can be determined by performing computer simulations on a design or model representing the multi-stage system 12. A user interface (not shown) can be employed to provide a program signal (PROG) to set the parameters 26 based on the simulations for the multi-stage system 12. For example, offline by simulations, such as circuit simulations employing SPICE software or other design tools, can be employed to determine maximum hardware capacity for the multi-stage system 12. As part of the offline process, hardware capacity and corresponding parameter limits can be determined for each stage 14, 16 and 18 over a plurality of test cases. Each test case can characterize a subscriber loop or other test circuit with which the system 10 may be implemented. The test cases can also consider a number of different analog process corners for each subscriber loop or test circuit.

Thus, the parameters 26 can include a maximum gain limit for achieving a minimum variation in the hardware capacity that can be achieved within a limit of gain for another stage, such as an analog equalizer stage. The parameters 26 also can include a value for a target output signal that can be achieved for each of the respective stages 14, 16 and 18.

Figure 2:
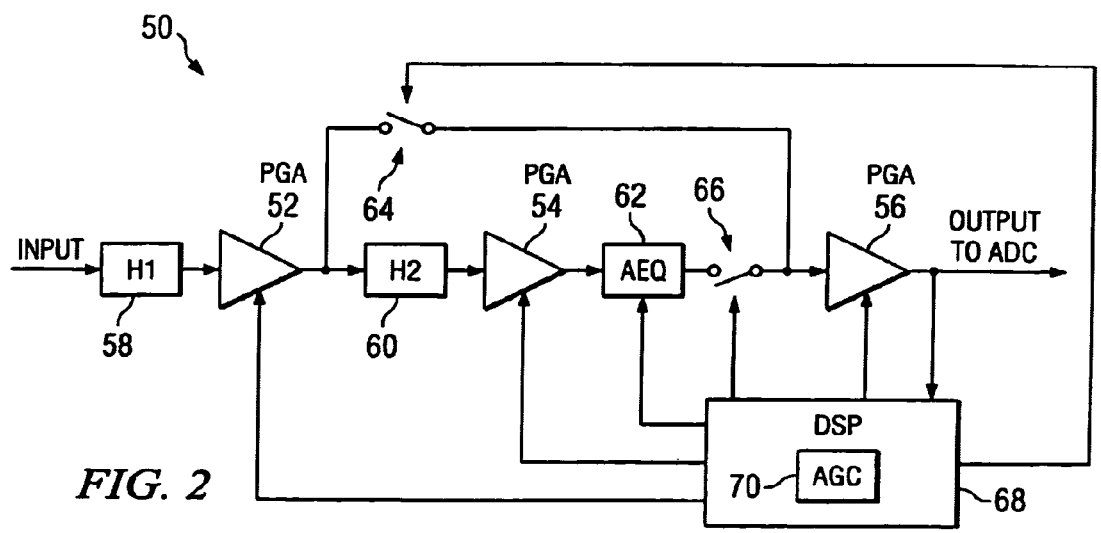
FIG. 2 depicts an example of another of a multi-stage gain system that can be implemented in accordance with an aspect of the present invention.

FIG. 2 depicts an example of a programmable gain system 50 that can be implemented according to an aspect of the present invention. The programmable gain system 50 includes a plurality of programmable gain amplifier PGA stages 52, 54 and 56 connected in series between an INPUT and an OUTPUT. A plurality of filters (e.g., high pass filters) 58, and 60 are interleaved in series with the respective PGAs 52 and 54 to attenuate upstream signals. An analog equalizer (AEQ) 62 is coupled between PGA 54 and PGA 56. Each of the filters 58, 60 and possibly the AEQ 62 implement respective transfer functions for attenuating or emphasizing selected frequency components from the signal path, including noise generated by the respective PGAs 52, 54 and 56. The plurality of switches 64 and 66 are connected between various points along the signal path of the system 50 for selectively monitoring and/or isolating selected gain stages including the PGAs 52, 54 and 56 and the AEQ 62.

A digital signal processor (DSP) 68 is coupled to each of the respective PGAs 52, 54 and 56 and the AEQ 62. The DSP 68 is also connected to the respective switches 64 and 66. The DSP 68 is programmed to implement an automatic gain control algorithm (AGC) 70. The DSP 68 employs the AGC algorithm 70 to configure the gain for each of the respective PGAs 52, 54 and 56 and the AEQ 62, such as in connection with a training process for the system 50. To facilitate setting the gains for the each of the respective PGAs 52, 54 and 56 and the AEQ 62, the DSP 68 can control the switches 64 and 66 to selectively isolate different stages of the system 50.

As an example, the system 50 can be implemented as part of an analog front end that forms at least part of a receiver in a digital subscriber line (DSL) modem. The DSP 68 employs the AGC algorithm 70 according to the received time domain INPUT signal at the INPUT and determines appropriate gain settings for each of the respective gain stages 52, 54 and 56 by measuring the RMS (Root Mean Square) of the INPUT signal. For instance, during a training sequence, such as defined by ITU standard G.992.1, a client modem of which the system 50 is being implemented can transmit a signal REVERB (e.g., REVERB1, REVERB2, REVERB3) and receive a corresponding REVERB.

As part of the training sequence, the AGC algorithm 70 sets the gains of the PGAs 52, 54, 56 and the AEQ 62 in the order according to the noise dominance of the respective stages (e.g., the relative effectiveness in reducing dominant noise in the system 50). The noise dominance of the respective stages 52, 54, 56 and 62 can be determined by performing offline simulation, by implementing online modem diagnostics as well as according to known process corners, which also may be derived from design data. Those skilled in the art may understand and appreciate other ways in which relative noise dominance between the respective stages 52, 54, 56 and 62 can be characterized based on the teachings contained herein.

Figure 3:
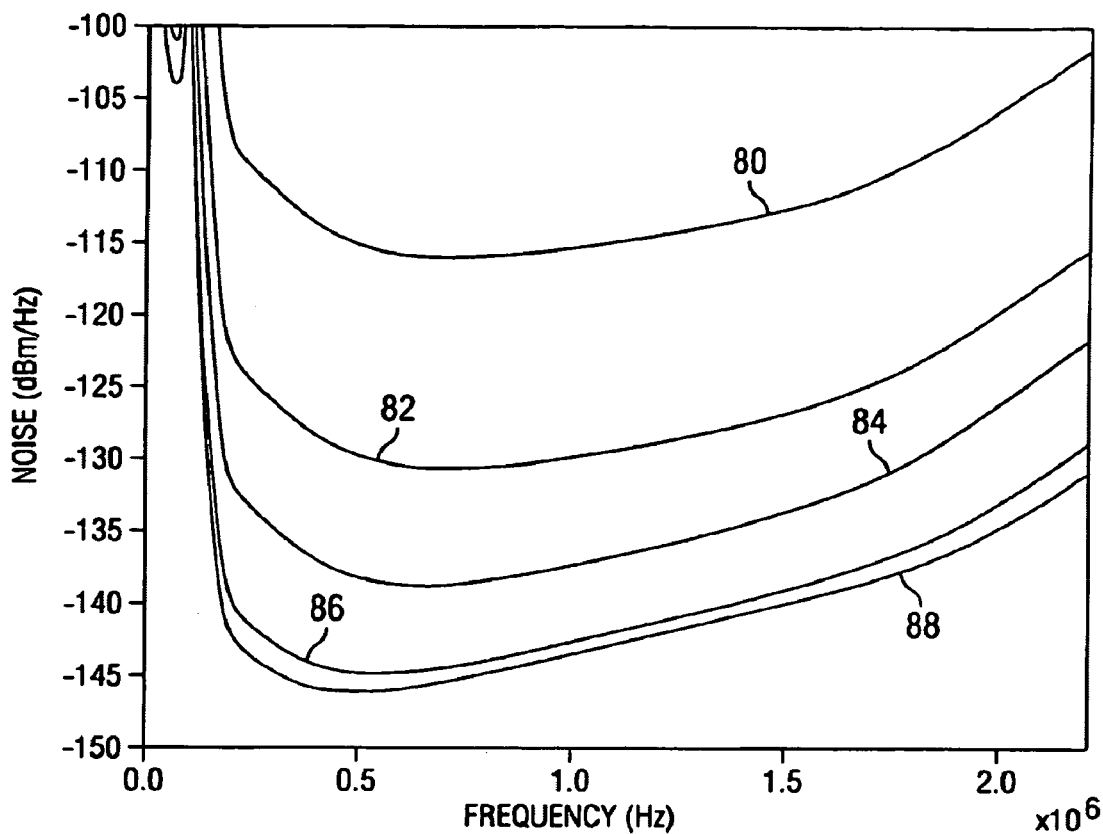
FIG. 3 is a graph depicting noise characteristics referred to the system input associated with variations in a component of a multi-stage system.
Figure 4:
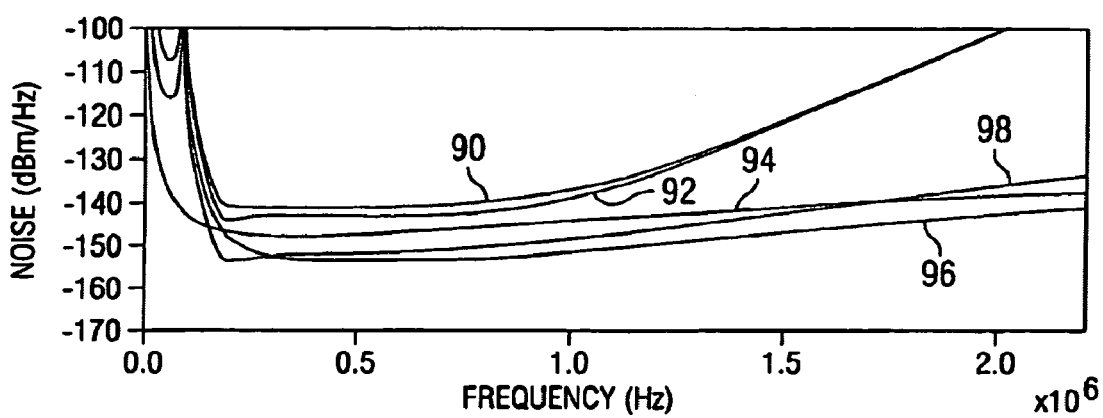
FIG. 4 is a graph depicting noise characteristics referred to the system input associated with different components of a multi-stage system for a first setting of a given one of the components of the system.
Figure 5:
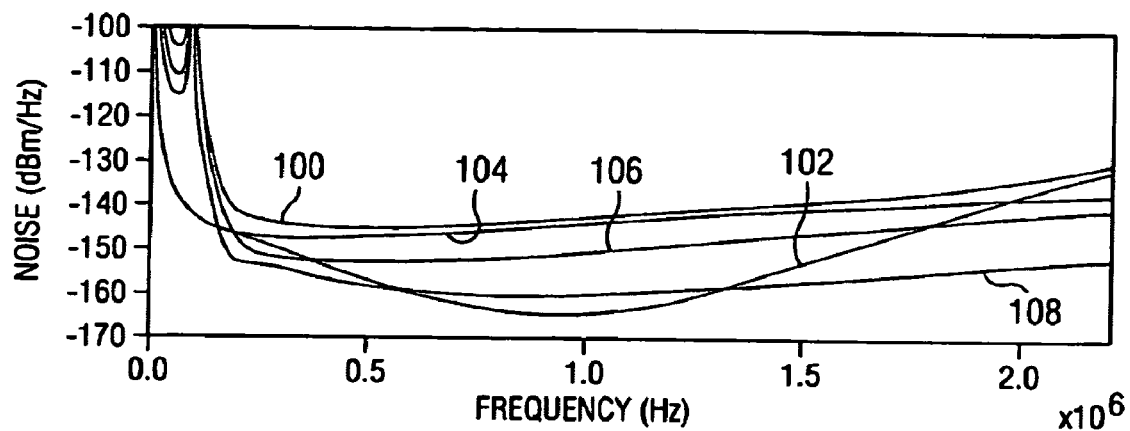
FIG. 5 is a graph, similar to FIG. 4, depicting noise characteristics referred to the system input associated with different components of a multi-stage system for a second setting of the given component of the system.

In one example, noise dominance can be ascertained from an input referred received noise floor for the system 50 over various gain settings of the respective stages 52, 54, 56 and 62. Examples of selected noise characteristics referred to the system input for the system 50 are depicted in FIGS. 3, 4, and 5. While, for ease of explanation, three such graphs are depicted in FIGS. 3, 4, and 5, those skilled in the art will understand and appreciate that typically a greater number of plots over an increased number of gain settings are utilized to ascertain relative noise dominance among the respective stages 52, 54, 56 and 62.

FIG. 3 depicts a plot of the input referred noise floor for various gain settings for the PGA 52 that is shown in FIG. 2. In particular, FIG. 3 depicts the noise as a function of frequency for five incremental gain settings of the PGA 52 (FIG. 2). For example, a first curve 80 depicts an input referred received noise floor for a gain setting of −15 dB for the PGA 52, curve 82 represents the noise floor for a 0 dB gain setting, curve 84 represents the noise floor for a 9 dB gain setting, curve 86 represents the noise floor for an 18 dB gain setting, and curve 88 represents the noise floor for a 27 dB gain setting. For each of the curves 80 through 88 shown in FIG. 3, the other PGAs 54 and 56 in the system 50 of FIG. 2 were provided with a fixed 0 dB gain, and the AEQ is set to a fixed gain setting of 25 dB per MHz.

FIGS. 4 and 5 depict the input referred noise floor for different noise-contributing components in the system 50 according to two example gain settings for the AEQ 62 and fixed gain settings for PGAs 52, 54 and 56 shown in FIG. 2.

FIG. 4 includes a set of curves 90, 92, 94, 96 and 98 corresponding to input referred received noise floors associated with various components for an AEQ setting of 0 dB per MHz. In particular, the curve 90 represents the noise floor for the total received noise, such as at the INPUT signal provided to the filter 58. Curve 92 represents the noise floor for an ADC referred to the system input with some gain settings for PGAs 52, 54, 56 and AEQ 62 (e.g., 0 dB per MHz). The curves 94 and 96 represent input referred received noise floors associated with the respective filters 58 and 60 for the system of FIG. 2. The input referred received noise floor for the AEQ 62 is represented by curve 98 in FIG. 4.

In FIG. 5, the input referred received noise floor associated with various components is depicted as curves 100, 102, 104, 106 and 108 for an AEQ setting of 25 dB per MHz. The set of curves 100, 102, 104, 106 and 108 are analogous to the curves 90, 92, 94, 96 and 98 in FIG. 4. In FIG. 5, curve 100 corresponds to the input referred received noise floor for the total received noise. The curve 102 represents the input referred received noise floor associated with the ADC. Curves 104 and 106 represent the input referred received noise floor associated with the respective filters 58 and 60. Finally, the input referred received noise floor associated with the AEQ 62 is represented by the curve 108. A comparison of FIGS. 4 and 5 demonstrates that the input referred received noise floor associated with the ADC, which is depicted as curve 92 in FIG. 4 and as curve 102 in FIG. 5, becomes a non-dominating source for the case of FIG. 5 in which the AEQ setting is at 25 dB per MHz.

Those skilled in the art will understand and appreciate that different stages can have different effects on the overall received noise floor. A maximum amount of gain can be applied to a system depending on the received signal, echo signal or both depending on channel conditions. Therefore, as the gain of one stages varied the distribution of gains between the respective stages 52, 54, 56 and 62 can affect the overall noise floor. Accordingly, the AGC algorithm 70 in FIG. 2 is programmed so as to set the gain for the respective stages for achieving an optimal gain, with order for the stages selected according to the noise relative contributions and noise characteristics of the respective stages.

The following example assumes that the ADC at the output of the PGA 56 and the PGA 52 represent dominant noise sources, such as based on an analysis of noise characteristics (e.g., including the noise floor information provided by FIGS. 3-5). The AGC algorithm 70 configures the gain stages that are most effective on dominant noise sources, namely AEQ 62 and the PGA 52, before setting gains for the non-dominant noise sources, PGAs 54 and 56. The AGC algorithm 70 is pre-programmed with parameters that enable the AGC algorithm to set gains for the AEQ 62 and the PGAs 52-56 so that a maximum hardware capacity can be achieved. The parameters can include a gain limit value for the AEQ 62 and a RMS threshold value for the PGA stages 52-56. Some or all of such parameters can be determined as part of an offline process. For instance, the RMS threshold can be ascertained by the modem developer and the gain limit value can be determined in an offline design process.

By way of example, a gain limit (GMaxLimit) for the AEQ can be determined by simulation with a design for the system 50 over a plurality of test cases. The set of test cases can be derived to implementing the system 50 in a set of N representative test loops and include M analog process corners over K AEQ hardware settings, where each of N, M and K are positive integers (N denoting the number of test loops, M denoting the number of process corners and K denoting the number of AEQ settings).

For each test loop and analog process corner, a hardware capacity, denoted by $R_n$ (i) kbps, is determined for each AEQ setting. An AEQ gain $G_n$ (i)dB also is determined for each test case, where i represents an incremental AEQ setting and n denotes the test case number. The test loop number and analog process corner can be combined and represented by a corresponding test case number. For example, if there are 5 test loops and 4 analog process corner, then there will be 20 test cases (n=20).

The simulations can be performed for the set of AEQ settings for each test case. For instance, the process can be implementing by initializing the AEQ 62 to its minimum hardware setting. PGA 52 (the next dominant noise source) is selected to meet the predetermined RMS threshold for the initial AEQ setting. Then, PGA 54 and PGA 56 (the non-dominant stages) are selected to meet the target RMS threshold, also for the initial AEQ setting. The target RMS can be a predetermined target RMS value or, alternatively, it can be adaptively determined during a configuration process. For each test case, the hardware capacity $R_n$ (i) can be recorded, such as stored in suitable memory or storage device. After the hardware capacity $R_n$ (i) has been determined and stored for the initial AEQ setting, the AEQ setting can be incremented (e.g., by one step) and the hardware capacity $R_n$ (i) be determined based on selecting the other PGAs according to the RMS threshold, as described above. This process can be repeated until the hardware capacity $R_n$ (i) has been determined for all AEQ settings (ranging from 0 to K) for each test case.

After the hardware capacity values have been determined for each of the test cases, a maximum hardware capacity $RMax_n$ kbps and the corresponding AEQ gain $GMax_n$ dB can be determined for each test case over the set of K AEQ settings. For example, $RMax_n$ and $GMax_n$ can be determined through simulations, which can be represented as:

$$RMax_n, GMax_n = \max(R_n(i)) \qquad \text{Eq. 1}$$

where: $0 \leq i < K$, where K is a maximum AEQ setting; and n=positive integer denoting a given test case.

For each test case, a selected hardware capacity $RSel_n$ is also determined as the maximum capacity in which the AEQ gain $G_n(i)$ is less than a gain limit GLim dB. The gain limit GLim spans from a minimum gain to the maximum gain of $GMax_n$ for the N test cases with x dB steps. That is, GLim can be expressed as follows:

$$GLim(l) = \min(GMax_n) + l \times x \qquad \text{Eq. 2}$$

where l denotes an incremental gain setting for $0 \leq l \leq X$, X denotes the total number of gain steps, and where $$x = \frac{\max(GMax_n) - \min(GMax_n)}{X} dB. \qquad \text{Eq. 3}$$

The selected hardware capacity $RSel_n$ for each gain setting l can further be expressed as follows:

$$RSel_n(l) = \max[R_n(i), G_n(i) \leq GLim(l)] \qquad \text{Eq. 4}$$

for $0 \leq i < K$, $0 \leq l \leq X$.

A maximum delta (or difference) DMax(l) between the selected capacity $RSel_n$ and the maximum capacity for $RMax_n$ is determined over the N test cases for each gain limit GLim(l). The difference $Delta_n(l)$ between the selected capacity $RSel_n$ and the maximum capacity for $RMax_n$ can be determined for each gain step over the set of N test cases, as follows:

$$\text{Delta}_n(l) = abs(RMax_n - RSel_n(l)) \quad \text{Eq. 5}$$

for $0 \leq l \leq X$

From the foregoing, the maximum delta DMax(l) can be determined as follows:

$$DMax(l) = \max[\text{Delta}_n(l)] \quad \text{Eq. 6}$$

for $0 \leq l \leq X$

The maximum gain limit GMaxLim for the AEQ 62 corresponds to the maximum AEQ gain limit GLim that provides a minimum value for the maximum delta DMax(l), which can be expressed as follows:

$$GMaxLim = GLim(l), \min[DMax(l)]. \quad \text{Eq. 7}$$

The AGC 70 is further programmed to perform training based on the maximum gain limit GMaxLim and one or more other parameters, including the RMS threshold (e.g., target RMS). The AGC algorithm 70 utilizes these parameters during a training sequence to set gains for the AEQ 62 and the PGAs 52 through 56. An order for configuring and training the respective programmable gain stages 52 through 56 and 62 is determined based on relative noise dominance of the respective components, such as described herein. For purposes of explanation and by way of example, the following order is employed: AEQ 62 first, the PGA 52 next, which are then followed by the non-dominant stages including the PGAs 54 and 56. The particular order of the remaining PGAs 54 and 56 can vary when the noise dominance attributable to such more noise dominant components is relatively insignificant when compared to the noise dominance of the other components 52 and 62. That is, according to this example order, setting the gain of the AEQ 62 and the PGA 52 is considered more effective in reducing dominant noise in the system 50 than the other stages 52 and 62.

The AGC algorithm 70 can be implemented to set gains of the stages 52-56 and 62 based on the predetermined parameters, which can include the GMaxLim for the AEQ and RMS thresholds for the PGAs 52-56. That is, the AEQ 62 is configured without exceeding GMaxLim dB. The AGC algorithm 70 also sets the PGA 52 to meet the target RMS parameter without saturating such component, such that sufficient headroom is maintained for the AEQ 62 to meet substantially the maximum gain limit GMaxLim. The other PGAs 54 and 56 are selected also to meet the targetRMS. The targetRMS can be set to a value such that the available digital headroom can accommodate the PAR (peak-to-average ratio) difference between REVERB signal (during AGC training) and Showtime signals (e.g., higher PAR during normal operation).

By way of further example, the AGC algorithm 70 can begin a training (or re-training) sequence for distributing gains among the stages 52-56 and 62 by initializing all PGAs to their minimum gain settings. Once the stages have been initialized to their minimum settings, the DSP 68 can employ the AGC algorithm 70 to measure signal RMS for a number of frames and calculate an average (e.g., median or mean) RMS signal value from the measurements, denoted as X. X thus corresponds to average RMS value for the system 50 when all gain stages are set to minimum settings. According to the order for noise dominance and to corresponding gain limits mentioned above, the AGC algorithm 70 then sets the gain for the AEQ 62 based on measurements performed over range of AEQ settings.

For example, the AGC algorithm 70 can increment to a next AEQ setting and for this setting measure signal RMS for a number of frames. The AGC algorithm 70 determines an average RMS signal Y for this AEQ setting based on the measurements. The AGC algorithm 70 determines whether the present gain setting for the AEQ exceeds the maximum gain limit GMaxLim as a function of the average RMS values X and Y. If $20*\log10(Y/X) \leq GMaxLim$ dB and the AEQ setting is not at maximum hardware setting, the AGC algorithm 70 can increment a step to a next AEQ setting. The AGC algorithm 70 can then measure signal RMS for a number of frames at this next incremental AEQ setting and determine a corresponding average RMS value Y. The AGC algorithm 70 can repeat this loop until an AEQ setting provides an average RMS value Y that meets the condition $20*\log10(Y/X) > GMaxLim$ dB. If the GMaxLim is exceeded, the AGC algorithm 70 can decrement the AEQ setting by one incremental step, to provide an AEQ setting that affords a maximum hardware capacity for the system 50. After the AEQ 62 has been configured to such setting, the remaining stages can be configured in order of their relative ability to reduce dominant noise (e.g., PGA 52, followed by PGAs 54 and 56). Alternatively or additionally, a parameter of the AEQ 62, such as channel slope, can be configured based on the comparison.

The AGC algorithm 70 thus increments a PGA setting for the PGA 52 and measure the signal RMS for a number of frames at this setting. The AGC algorithm 70 then determines an averageRMS value based on the measurements. The AGC algorithm 70 ascertains whether the averageRMS value is within an expected operating parameter, namely the targetRMS (described above). For example, so long as averageRMS≦targetRMS and PGA setting is not at maximum hardware setting, the AGC algorithm repeats the foregoing process by incrementing the PGA setting for the PGA 52, measuring the signal RMS and determining a corresponding averageRMS value. If averageRMS>targetRMS, however, the AGC algorithm decrements PGA setting to a previous (e.g., lower) setting to complete selection and configuration of the PGA 52. The AGC algorithm 70 can perform a similar process to set gains for the remaining PGAs 54 and 56.

Those skilled in the art will understand and appreciate that the adaptation of the PGA stage, described above, can be repeated for multiple iterations if necessary. In the example described above, the first PGA stage 52 and the AEQ 62 have the most effect on the dominant noise in the receive path. Accordingly, multiple (e.g. two) iterations can be applied to selection of the PGA 52. For example, during the first iteration, the AGC algorithm 70 can set the PGA 52 to a maximum setting without saturation at the output of the PGA 52. During the second iteration, the AGC algorithm 70 sets the PGA 52 so that, when AEQ gain is set to GMaxLim dB, the receive signal RMS (including all stages) at AEQ output does not exceed targetRMS and the PGA 52 does not exceed the maximum gain setting (determined in first iteration). In this way, the GMaxLim dB required for the AEQ 62 will be mostly sacrificed by PGA 54 instead of PGA 52.

Figure 6:
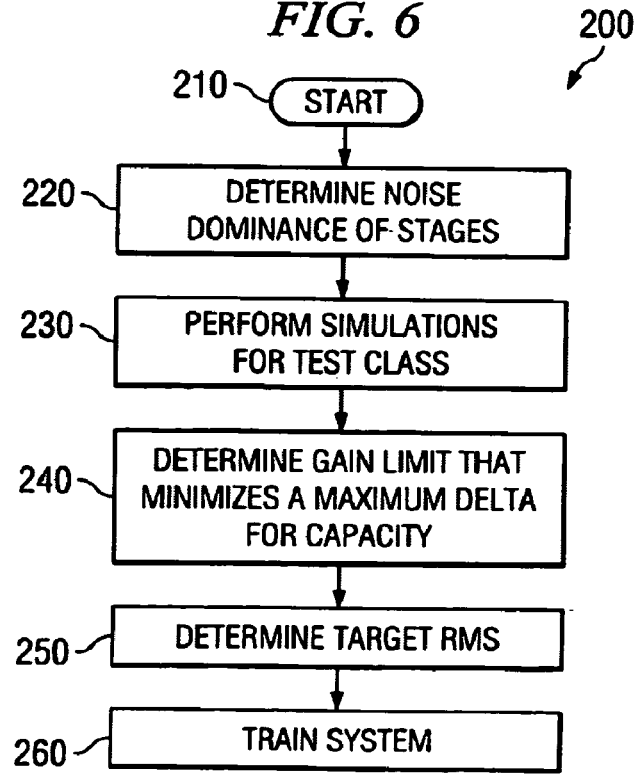
FIG. 6 depicts an example of a method for implementing automatic gain control in accordance with aspect of the present invention.

FIGS. 6, 7, and 8 depict methods that can be performed in connection with implementing automatic gain control for a multi-stage system according to an aspect of the present invention. While, for purposes of simplicity of explanation, the methodologies are shown and described as executing serially, it is to be understood and appreciated that the present invention is not limited by the orders shown, as some aspects may, in accordance with the present invention, occur in different orders or concurrently from that shown and described herein. Moreover, not all features shown or described may be needed to implement a method in accordance with the present invention. Additionally, such methods can be implemented in hardware (e.g., analog circuitry, digital circuitry or a combination thereof), software (e.g., running on a DSP or ASIC) or a combination of hardware and software. Those skilled in the art will understand how to program appropriate components (e.g., a DSP implemented in a DSL modem) to implement the methods based on the teachings contained herein.

FIG. 6 depicts a flow diagram for an example method 200 that can be performed to configure a programmable gain system. The programmable gain system includes a plurality of stages, such as may be interleaved with one or more filters. The method 200 begins at 210 after a circuit design for the programmable gain system has been developed. Associated design data or a model for the design can also be provided (e.g., by the developer) for the programmable gain system, which design data can characterize system components, interconnectivity and operating parameters to achieve maximum hardware capacity thereof. The design data can also characterize process variations for the design, such as part-to-part variations and process corners.

At 220, relative noise dominance is determined for the plurality of stages. The noise dominance, for example, can be determined by evaluating input referred noise floors associated with the various stages of the multi-stage system, and determining which stages have a greater effect on the dominant noise in the signal path. An order for configuring the plurality of stages thus can be established. At 230, simulations can be performed for a plurality of test cases. The simulations can be implemented based on the design data to ascertain parameter limits for establishing operating characteristics for each of the plurality of stages. As described herein, the plurality of stages can include programmable gain stages as well as an analog equalizer, also having an associated gain. At 240, a gain limit is determined based on the simulations performed at 230. The gain limit (see, e.g., GMaxLim of Eq. 7) corresponds to a gain for an analog equalizer that maximizes hardware capacity and minimizes a maximum delta (see, e.g., DMax(l) of Eq. 6) for a hardware capacity.

At 250, a target RMS value is determined for the entire system. The target RMS can be determined to be a target RMS value. For the example of a DSL communications protocol, the target RMS value can correspond to a signal value, such that the available digital headroom can accommodate peak-to-average ratio differences between the REVERB signals and Showtime signals.

At 260, the various stages are set during a training process. The training process is implemented on stages selected according to an order determined at 220 based on the relative noise dominance of the stages. For example, the stages can be configured an order beginning with the stage(s) most effective to reduce dominant noise and ending with the stage(s) having the least effect on noise. After the more noise dominant stages have been successfully configured, the remaining less noise dominant stages can be programmed. The result is a multi-stage gain system configured to operate at a maximum hardware capacity that also mitigates part-to-part variations.

FIG. 7 depicts an example of a method 300 that can be utilized to establish a maximum gain limit for configuring the most effective stage (or stages), an analog equalizer (AEQ). The method 300 begins at 310 in which test parameters are defined. The test parameters, for example, can include identifying a number of test cases. The test cases can vary based on a number of test loops, a number of analog process corners and a number of available hardware settings for the AEQ.

At 320, the AEQ is set to an initial setting Setting$_K$, where K is an integer denoting an incremental gain setting for the AEQ. At 330, the stages are configured, such as to meet a target threshold. At 340, the hardware capacity (e.g., data rate) of the system is measured and stored for the corresponding test case. At 350, a determination is made as to whether any additional AEQ settings exist. If additional AEQ settings do exist (YES), the method proceeds to 360. At 360, the incremental variable K is incremented and the method returns to 320 for repeating 320 through 350 for the next AEQ setting (e.g, K=K+1). If no additional AEQ settings exist (NO), the method proceeds from 350 to 370.

At 370, a maximum hardware capacity RMAX and MAX gain are determined for each of the test cases. It is to be appreciated that the determination of the capacity and gain for the respective test cases, alternatively, may be determined as part of the loop from 320 to 360. At 380, a selected maximum hardware capacity RSEL is determined for a condition when the AEQ setting is less than a gain threshold determined for each of the test cases. The gain threshold, for example, spans from the minimum to the maximum of the maximum gain limit for the respective test case.

At 390, a maximum difference between the RMAX and RSEL is determined for each of the respective test cases. At 400, a maximum gain limit is determined for the AEQ the maximum gain limit thus defines a value for the AEQ setting that minimizes the maximum difference determined at 390.

FIG. 8 depicts a method 450 that can be utilized to program a multi-stage system, such as the systems shown and described herein. The method 450 begins at 460 in which training parameters are defined. The training parameters can include a maximum gain limit for an analog equalizer (AEQ) as well as a target RMS value associated with a plurality of programmable gain stages. The training parameters can also include available ranges of incremental gain settings for each of the respective stages in the multi-stage system. The parameters can be determined as part of an offline process, although some (or all) parameters could also be determined or adjusted based on the context in which the system is being implemented.

At 480, an order is set for the various stages, which order varies depending on the relative noise dominance for each of the respective stages. The noise dominance of one or more stages can be determined by online measurements or based on previous measurements or design data. At 490, each of the stages is set to its initial settings, which can include the minimum incremental settings for the respective stages. At 500, a signal RMS for the respective stages is measured such as for a plurality of frames. An average RMS value is then determined based on the signal RMS measurements. For a multi-stage system that does not include an analog equalizer, the measurements and determination of the average RMS value for the minimal gain settings can be omitted from the method 450. At 510, the hardware setting (SETTING$_i$) for the respective stage (STAGE$_j$) being configured is incremented to a next incremental setting at 510, where i denotes an incremental setting and j denotes a selected stage. The signal RMS is then measured and a corresponding RMS value (RMS$_{ij}$) is determined for the current SETTING$_i$ and STAGE$_j$. The signal RMS$_{ij}$ value for the current SETTING$_i$ and STAGE$_j$ can be an average signal value, such as a mean or median value.

At 530, a determination is made as to whether the average RMS value (RMS$_{ij}$) is within an expected operating parameter for such stage (such as defined at 460). If the determination at 530 is negative, the method returns to 510 in which the setting (SETTING$_i$) for the present STAGE$_j$ (according to the order) is incremented to its next hardware setting (i=i+1). At 530, if the average RMS is determined to be within the expected maximum operating parameter (YES), the methodology proceeds to 540. At 540, a determination is made as to whether any additional stages need to be configured during the training sequence. If additional stages do exist (YES), the method proceeds to 550 in which the next stage is selected (e.g., by incrementing j=j+1) for training according to the order set at 480.

From 550 the method 450 returns to 510 to repeat 510 through 540 for the next stage STAGE$_j$ in the order. In this way, each stage is configured such that the most noise dominant stages are set first. The interdependence and distribution of gains for the respective stages thus can be programmed to maximize hardware capacity as well as to minimize analog process variations associated with the multi-stage system. After each of the stages has been appropriately configured, the methodology ends at 560. The method 450 can be repeated periodically, such as for retraining the multi-stage system. For the example when the method 450 is utilized for training a multi-stage system implemented in a receive path of a DSL modem, the retraining can be performed to accommodate changes in loop characteristics.

What have been described above are examples of the present invention. It is, of course, not possible to describe every conceivable combination of components or methodologies for purposes of describing the present invention, but one of ordinary skill in the art will recognize that many further combinations and permutations of the present invention are possible. For example, while the systems and methods herein have generally been described in the context of modems for digital subscriber lines, the systems and methods can be applied to various other types of systems employing multi-stage amplifiers. Accordingly, the present invention is intended to embrace all such alterations, modifications, and variations that fall within the spirit and scope of the appended claims.

What is claimed is:

1. A method for providing automatic gain control of a multi-stage system, comprising:
   defining at least one parameter associated with at least some of a plurality of gain stages of the multi-stage system;
   selecting an order for training the plurality of stages based on relative noise dominance for the plurality of stages;
   for a given stage of the plurality of stages selected according to the selected order, at least one given stage comprising an analog equalizer having a programmable gain setting which can vary as a function of frequency;
   training the analog equalizer stage using a criterion based on power gain;
   measuring output signals of the multi-stage system over a plurality of gain settings for the given stage; and
   configuring a gain setting of the given stage of the multi-stage system based on the measured output signals relative to the at least one parameter defined for the given stage, wherein the defined parameter for the analog equalizer comprising a maximum gain limit.

2. The method of claim 1, wherein the measuring and the configuring are performed for each of the plurality of stages according to the selected order.

3. The method of claim 2, wherein the configuring is performed to distribute gain among the plurality of stages according to a relative effectiveness of each of the plurality of stages to reduce noise in a path that includes the multi-stage system.

4. The method of claim 1, wherein the maximum gain limit is determined based on simulations performed on a design of the multi-stage system over a plurality of test cases, the maximum gain limit being operative to at least one of maximize the hardware capacity and mitigate part-to-part variations of the multi-stage system.

5. The method of claim 1, wherein the measuring and configuring further comprise:
   incrementing the gain setting of the analog equalizer to a next gain setting;
   measuring the output signal values of the multi-stage system over a plurality of frames;
   determining an average signal value for the multi-stage system based on the measured signal values for the analog equalizer at the next gain setting;
   comparing the maximum gain limit relative to a value functionally related to the average signal value; and
   setting at least one of the gain setting and a channel slope of the analog equalizer based on the comparison.

6. The method of claim 5, wherein the value functionally related to the average signal value comprises a logarithmic function proportional to the average signal value associated with the next gain setting and an average signal value of the multistage system associated with the plurality of stages when set at respective minimum gain settings.

7. The method of claim 1, wherein the given stage further comprises at least one other gain stage having a programmable gain setting, the defined parameter for the at least one other gain stage comprising a target threshold value for the output signal.

8. The method of claim 7, wherein the target threshold comprises a target RMS (root mean square) threshold for the output signal.

9. The method of claim 7, wherein the measuring and configuring further comprise:
   measuring RMS (root mean square) signal values for the output signals of the multi-stage system over a plurality of frames for at least a portion of the plurality of gain settings of the at least one other gain stage;
   determining average RMS values for the output signals associated with each of the at least a portion of the plurality of gain settings; and
   setting the gain setting of the at least one other gain stage based on the average RMS values relative to the target threshold value.

10. A digital signal processor programmed to perform an automatic gain control algorithm for a plurality of gain stages of a multi-stage gain system, the automatic gain control algorithm comprising:
    selecting an order for training the plurality of stages of the multi-stage system based on relative noise dominance among the plurality of stages;
    configuring each of the plurality of stages according to the selected order, the configuring of a given stage of the plurality of stages, wherein at least one given stage comprising an analog equalizer having a programmable gain setting which can vary as a function of frequency, comprising:
       training the analog equalizer stage using a criterion based on power gain;
       incrementing a gain setting for the given stage;
       measuring output signals over a plurality of frames at the incremented gain setting of the given stage;

evaluating the measured output signals relative to a parameter limit defined for the given stage for the incremented gain setting for the given stage, wherein the predetermined parameter limit associated with the analog equalizer comprising a maximum gain limit;

repeating the incrementing, measuring and evaluating for a next gain setting of the given stage based on the evaluation; and setting the gain setting of the given stage based on determining that the incremented gain setting affords a maximum hardware capacity for the given stage.

11. The digital signal processor of claim 10, wherein the configuring of the analog equalizer further comprise:

measuring output signal values of the multi-stage system over a plurality of frames for the incremented gain setting of the analog equalizer;

determining an average output signal value for the multi-stage system based on the measured output signal values associated with the incremented gain setting of the analog equalizer;

comparing the maximum gain limit relative to a value functionally related to the average signal value; and setting the gain setting of the analog equalizer based on the comparison.

12. The digital signal processor of claim 11, wherein, prior to the configuring of the given stage, the automatic gain control algorithm further comprises:

measuring output signal values of the multi-stage system over a plurality of frames with the plurality of stages at respective initial gain settings; and determining an average signal value of the multi-stage system for the initialized gain settings, the value functionally related to the average signal value comprising a logarithmic function comprising a ratio of the average signal value of the multi-stage system associated with the incremented gain setting of the analog equalizer and the average signal value of the multi-stage system associated with the initial gain settings.

13. The digital signal processor of claim 11, wherein the given stage further comprises at least one programmable gain amplifier having a programmable gain setting, the parameter limit for the at least one programmable gain amplifier comprising a target threshold value for the output signal.

14. The digital signal processor of claim 10, wherein the given stage further comprises at least one programmable gain amplifier having a programmable gain setting, the parameter limit for the at least one programmable gain amplifier comprising a target threshold value for the output signal.

15. The digital signal processor of claim 14, wherein the target threshold comprises a target value for the output signal of the multi-stage gain system.

16. The digital signal processor of claim 14, wherein the configuring of the at least one programmable gain amplifier further comprises:

measuring output signal RMS (root mean square) values of the multi-stage system over a plurality of frames for at least a portion of the plurality of gain settings of the at least one programmable gain amplifier;

determining an average RMS value for the output signal associated with each of the at least a portion of the plurality of gain settings; and setting the gain setting of the at least one programmable gain amplifier based on the average RMS value relative to the target threshold value.

17. The digital signal processor of claim 10, wherein the gain setting of each of the plurality of stages is set so that gain is distributed among the plurality of stages according to a relative effectiveness of each of the plurality of stages to reduce noise in a path that includes the multi-stage gain system.

18. A programmable gain system, comprising:

a plurality of serially coupled stages, each of the plurality of gain stages having an associated programmable gain setting, wherein at least one of the plurality of pain stages comprises an analog equalizer having a programmable gain setting which can vary as a function of frequency and at least one other stage of the plurality of gain stages comprises a programmable gain amplifier; and a control system that, during a training phase, sets the associated gain setting of each of the plurality of gain stages in an order, the associated gain setting being set to maximize hardware capacity and to mitigate part-to-part variation in the gain system based on at least one predetermined parameter, the pain the analog equalizer stage is set using a criterion based on power gain.

19. The programmable gain system of claim 18, wherein the control system comprises a digital signal processor programmed with an automatic gain control algorithm to set the associated gain settings of the plurality of gain stages, the automatic gain control algorithm operating to set the gain of each stage in the order, which is determined according to relative noise dominance of the plurality of gain stages.

20. The programmable gain system of claim 19, further comprising a switch system that includes at least one switch connected to at least one node along a path defined by the plurality of gain stages, the digital signal processor controlling the switch system for, according to the automatic gain control algorithm, measuring signal characteristics of a selected portion of the path during the training phase.

21. The programmable gain system of claim 19, further comprising at least one analog filter interleaved in a path that includes the plurality of gain stages.

22. The programmable gain system of claim 19, wherein the at least one parameter associated with the analog equalizer comprises a maximum gain limit for the analog equalizer that affords substantially maximum hardware capacity with reduced part-to-part variations for the gain system.

23. The programmable gain system of claim 22, wherein the digital signal processor employs the automatic gain control algorithm to configure the analog equalizer by performing a method that comprises:

incrementing a gain setting for the analog equalizer;

measuring output signal values of the multi-stage system over a plurality of frames for the incremented gain setting of the analog equalizer;

determining an average signal value for the multi-stage system based on the measured signal values associated with the incremented gain setting of the analog equalizer;

comparing the maximum gain limit relative to a value functionally related to the average signal value associated with the incremented gain setting of the analog equalizer; and setting the gain setting of the analog equalizer based on the comparison.

24. The programmable gain system of claim 23, wherein, prior to setting the associated gain settings of the plurality of gain stages, the automatic gain control algorithm performing a method that further comprises:

measuring output signal values of the multi-stage system over a plurality of frames with the plurality of gain stages set at respective initial gain settings; and determining an average signal value of the multi-stage system for the initial gain settings of the plurality of gain stages, wherein the value functionally related to the average signal value further comprises a logarithmic function comprising a ratio of the average signal value of the multi-stage system associated with the incremented gain setting of the analog equalizer and the average signal value of the multi-stage system associated with the initial gain settings of the plurality of gain stages.

25. The programmable gain system of claim 24, wherein the initial gain settings of the plurality of gain stages further comprise minimum gain settings for each of the plurality of gain stages.

26. The programmable gain system of claim 19, wherein the digital signal processor employs the automatic gain control algorithm to configure the at least one other gain stage by performing a method that comprises:

measuring output signal RMS (root mean square) values of the multi-stage system over a plurality of frames for at least a portion of the plurality of gain settings of the at least one other gain stage;

determining an average RMS value for the output signal associated with each of the at least a portion of the plurality of gain settings; and setting the gain setting of the at least one other gain stage based on the average RMS value relative to a target threshold value.

27. The programmable gain system of claim 26, wherein the target threshold value comprises a target RMS value for the output signal.

28. The programmable gain system of claim 19, wherein the automatic gain control algorithm is operative to configure each given stage of the plurality of gain stages according to the order by performing a method that comprises:

incrementing a gain setting for the given stage;

measuring output signals for a plurality of frames with the given stage at the incremented gain setting;

determining whether the incremented gain setting provides a maximum hardware capacity that mitigates part-to-part variations based on the measured output signals relative to the at least one predetermined parameter defined for the given stage;

repeating the incrementing, measuring and determining for a next gain setting of the given stage based on determining that the incremented gain setting does not provide at least the maximum hardware capacity for the given stage; and setting the gain setting of the given stage based on determining that the incremented gain setting provides at least the maximum hardware capacity for the given stage.

* * * * *